(12) United States Patent
Chen et al.

(10) Patent No.: US 8,661,388 B2
(45) Date of Patent: Feb. 25, 2014

(54) METHOD OF PACKING-BASED MACRO PLACEMENT AND SEMICONDUCTOR CHIP USING THE SAME

(75) Inventors: Tung-Chieh Chen, Taipei (TW);
Ping-Hung Yu, Kaohsiung (TW);
Yao-Wen Chang, Taipei (TW);
Fwu-Juh Huang, Taoyuan Hsien (TW);
Tien-Yueh Liu, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 493 days.

(21) Appl. No.: 12/571,576

(22) Filed: Oct. 1, 2009

(65) Prior Publication Data

US 2010/0023910 A1    Jan. 28, 2010

Related U.S. Application Data

(63) Continuation of application No. 11/608,417, filed on Dec. 8, 2006, now abandoned.

(60) Provisional application No. 60/755,954, filed on Jan. 3, 2006.

(51) Int. Cl.
*G06F 17/50* (2006.01)

(52) U.S. Cl.
USPC ........... 716/118; 716/119; 716/132; 716/135; 716/139

(58) Field of Classification Search
USPC .......... 716/118–119, 123–125, 132–135, 139
See application file for complete search history.

(56) References Cited

U.S. PATENT DOCUMENTS

| | | | |
|---|---|---|---|
| 4,300,019 A | 11/1981 | Toyomaki | |
| 4,630,219 A * | 12/1986 | DiGiacomo et al. | 716/123 |
| 4,815,003 A | 3/1989 | Putatunda et al. | |
| 5,661,663 A | 8/1997 | Scepanovic et al. | |
| 5,815,398 A * | 9/1998 | Dighe et al. | 700/217 |
| 6,002,857 A * | 12/1999 | Ramachandran | 716/122 |
| 6,262,628 B1 | 7/2001 | Shinomiya | |
| 6,308,309 B1 * | 10/2001 | Gan et al. | 716/122 |
| 6,378,121 B2 * | 4/2002 | Hiraga | 716/129 |
| 6,560,505 B1 * | 5/2003 | Kikuchi et al. | 700/121 |
| 7,308,666 B1 | 12/2007 | Li | |
| 7,665,054 B1 * | 2/2010 | Gopalakrishnan et al. | 716/122 |

FOREIGN PATENT DOCUMENTS

| | | |
|---|---|---|
| CN | 1545049 A | 11/2004 |
| CN | 1588380 A | 3/2005 |
| JP | 2297672 | 12/1990 |
| JP | 521760 | 1/1993 |
| JP | 2000276518 A | 10/2000 |

OTHER PUBLICATIONS

Wu et al., (Rectilinear Block Placement Using B*-tree, ACM, vol. 2, No. 2, Apr. 2003, pp. 188-202).*

(Continued)

*Primary Examiner* — Nghia Doan
(74) *Attorney, Agent, or Firm* — McClure, Qualey & Rodack, LLP

(57) ABSTRACT

A multi-packing tree (MPT) macro placer. The MPT macro placer comprises reading input files in a LEF/DEF format, creating a k-level binary multi-packing tree comprising k branch nodes each corresponding to one level and k+1 packing sub-trees each corresponding to one of the nodes and comprising a group of macros, optimizing the multi-packing tree according to a packing result thereof, and generating output files in a DEF format.

13 Claims, 11 Drawing Sheets

(56) References Cited

OTHER PUBLICATIONS

Lee et al., (Multilevel Floorplanning/Placement for Large-Scale Modules Using B*-tree, DAC, 2003, p. 812-817).*
Dhamdhere et al., (Module Placement with Pre-placed Module using the Corner Block List Representation, IEEE, 2002, pp. 349-352).*
CN Office Action mailed Jul. 4, 2008.
"B-Trees: A New Representation for Non-Slicing Floorplans" Yun-Chih Chang et al., Department of Computer and Information Science, National Chiao Tung University, pp. 458-463, 2000.
Office Action mailed in related U.S. Appl. No. 11/403,740 on Apr. 2, 2009.
JP Office Action mailed Jun. 16, 2009 and its English translation.
English abstract of CN1588380A.
English abstract of CN1545049A.
English abstract of JP521760.
English abstract of JP2000276518.
English abstract of JP2297672.
JP Office Action mailed Nov. 10, 2009 and its English translation.
"Multilevel Floorplanning/Placement for Large-Scale Modules Using B*-Trees" Lee et al., Annual ACM IEEE Design Automation Conference, pp. 812-817, 2003.
"Modern Floorplanning Based on Fast Simulated Annealing" Chen et al., International Symposium on Physical Design, pp. 104-112, 2005.

* cited by examiner

METHOD OF PACKING-BASED MACRO PLACEMENT AND SEMICONDUCTOR CHIP USING THE SAME

CROSS REFERENCE TO RELATED APPLICATIONS

This application is a Continuation of pending U.S. patent application Ser. No. 11/608,417, filed Dec. 8, 2006, which claims the priority of U.S. provisional application No. 60/755,954, filed on Jan. 3, 2006, and the entirety of which are incorporated herein for reference.

BACKGROUND OF THE INVENTION

1. Field of the Invention

The invention relates to mixed-size design of integrated circuits and, in particular, to packing-based macro placement.

2. Description of the Related Art

Due to use of IP (intellectual property) modules and embedded memories, a modern VLSI chip often comprises a large number of macros. Mixed-size placement of both macros and standard cells has become more popular in different applications. As a result, many mixed-size placement algorithms are disclosed in different publications.

A first type of mixed-size placement algorithm places macros and standard cells simultaneously, which typically does not consider macro orientations and requires a robust macro legalizer to remove overlaps if macros/cells are not distributed evenly. A simulated annealing based multilevel placer mPG-MS, disclosed in Proceedings of ACM/IEEE Asia South Pacific Design Automation Conference by C.-C. Chang et. al in 2003, fixes macros level by level from large macros to small macros. A min-cut based pacer Feng Shui, disclosed in Proceedings of ACM International Symposium on Physical Design by A. Khatkhate et. al in 2004, considers standard cells and macros simultaneously using a fractional cut technique, which allows horizontal cut lines to not align with row boundaries. In addition, several analytical approaches have been proposed to accomplish mixed-size placement. APlace, disclosed in Proceedings of the IEEE/ACM International Conference on Computer-Aided Design by A. B. Kagng et. al in 2004, uses a bell-shaped potential function considering macro heights/widths based on non-linear programming to determine a global placement which evenly distributes macros/cells. mPL, disclosed in Proceedings of ACM International Symposium on Physical Design by T. Chan et. al in 2005, uses a generalized force-directed method for placement. UPlace, disclosed in Proceedings of ACM International Symposium on Physical Design by B. Yao et. al in 2005, uses quadratic programming and a discrete cosine transformation method to distribute macro/cells evenly, and a zone refinement technique for legalization is then applied.

A second type combines floorplanning and placement techniques. A min-cut floorplacer Capo, disclosed in Proceedings of the IEEE/ACM International Conference on Computer-Aided Design in 2004, is an example. The fixed-outline floorplanning is applied when necessary during min-cut placement to find allowable positions for macros. Embedded into a placement flow, floorplacement can consider macro orientations and find legal solutions more easily.

A third type separates the mixed-size placement into two stages, macro placement and standard-cell placement. Macro positions are determined before standard cells are placed into the rest area. A combinational technique is disclosed in ACM Transactions on Design Automation of Electronic Systems by S. N. Adya in 2005. A standard cell placer is used to obtain an initial placement. Standard cells are clustered as several soft macros based on the initial placement, and fixed-outline floorplanning is applied to find an overlap-free macro placement. Then, macros are fixed and standard cells replaced using a standard cell placer in the remaining space. Compared with the other types, the two-stage mixed-size placement is more robust since it guarantees a feasible solution as long as an overlap-free macro placement is obtained. Furthermore, macro orientations and placement constraints, such as pre-placed macros and placement blockages, can be easily handled.

BRIEF SUMMARY OF THE INVENTION

An embodiment of a semiconductor chip comprises first and second groups of macros. The first and second groups of macros are respectively close packed toward first and second directions of the semiconductor chip.

Another embodiment of a semiconductor chip comprises first and second groups of macros. The first and second groups of macros are respectively close packed toward first and second edges of the semiconductor chip.

Another embodiment of a semiconductor chip comprises first and second groups of macros. The first and second groups of macros are respectively close packed toward first and second corners of the semiconductor chip.

An embodiment of a k-level binary multi-packing tree comprises k branch nodes and k+1 packing sub-trees. Each of the k branch nodes corresponds to one level. Each of the k+1 packing sub-trees comprises a group of macros and corresponds to one of the nodes.

An embodiment of a method of macro placement comprises creating a k-level binary multi-packing tree as disclosed and packing the macros of each packing sub-tree in a placement region.

An embodiment of a multi-packing tree (MPT) macro placer comprises reading input files in a LEF/DEF format, creating a k-level binary multi-packing tree, optimizing the multi-packing tree according to a packing result thereof, and generating output files in a DEF format. The k-level binary multi-packing tree comprises k branch nodes each corresponding to one level and k+1 packing sub-trees each corresponding to one of the nodes and comprising a group of macros.

An embodiment of a mixed-size placement design flow comprises reading initial input files in a LEF/DEF format, performing preliminary macro placement with a conventional macro placer, performing detailed macro placement with the disclosed MPT macro placer, and generating final output files in a DEF format.

An embodiment of a cost function for evaluating a macro placement comprises at least one parameter of area of the macro placement, total wirelength of real nets and pseudo nets in the macro placement, total macro displacement from a preliminary macro placement, overlap length of the macro placement, and thickness of the macro placement.

The invention provides a multi-packing tree (MPT)-based macro placer which places macros around a boundary of a placement region and reserves a center thereof for standard cells. The MPT macro placer is very fast for operations and packing of binary trees, with only amortized linear time needed to transform an MPT to its corresponding macro placement. As a result, a solution of macro placement is efficiently searched by simulated annealing. The packing techniques are, further, efficient and effective for area minimization, such that the MPT-base macro placer can solve mixed-size placement problems with very large macros and a large number of macros. Since macro orientations and spacing between macros are considered, the MPT-base macro placer leads to significantly shorter wirelength and less congestion than other mixed-size placers. The MPT-base macro placer can also easily function within various placement constraints, such as pre-placed blocks, corner blocks, and placement blockages. The MPT-base macro placer can be combined with state-of-the-art standard cell placers to obtain better mixed-size placement solutions based on a two-stage mixed-size placement flow.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
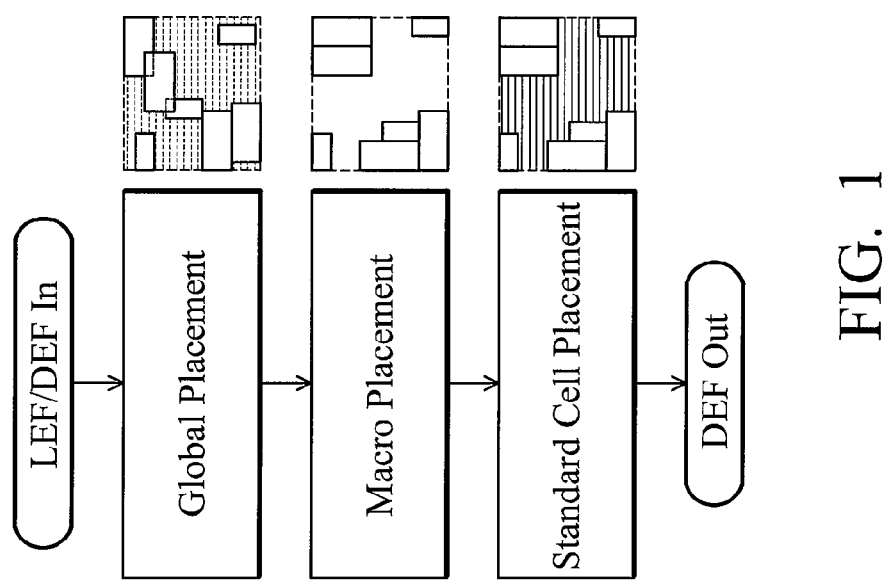
FIG. 1 shows a mixed size placement flow chart.

FIG. 1 shows a mixed size placement flow chart. One feature of the design strategy according to this invention is to place macros around the chip and reverse the chip center to place standard cells. Since macros are usually large and there are routing blockages in the macros, if macros are placed in the chip center they will affect routing very much. The traditional floorplanning techniques cannot directly apply to the macro placement problem since it packs all macros to one corner. To overcome this problem, a new Multi-Packing-tree floorplan representation is proposed based on a new Packing-tree representation to place macros around the chip.

A Packing-tree is a binary-tree for modeling non-slicing or slicing floorplan. Each node in the Packing-tree corresponds to a macro block. There are four types of packing of a Packing-tree. BL-, TL-, TR-, and BR-packing pack the blocks to the bottom-left, top-left, top-right, and bottom-right corners, respectively.

Figure 2:
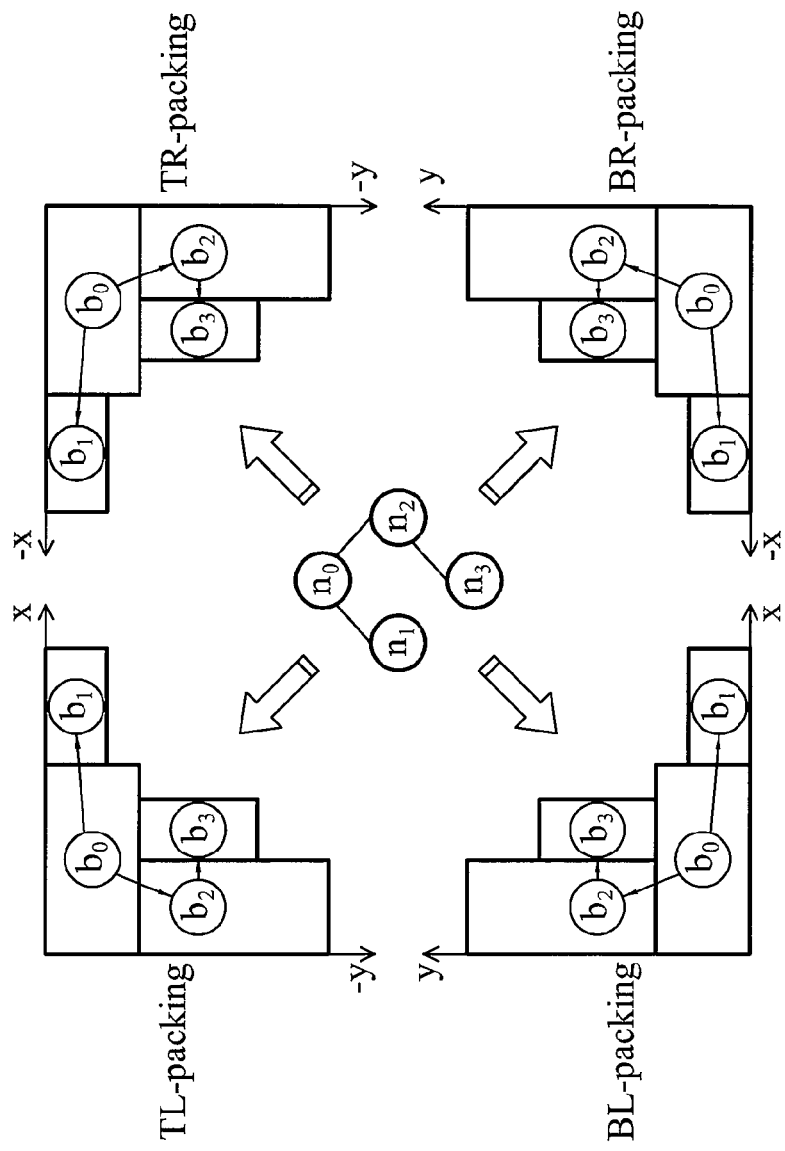
FIG. 2 shows a Packing-Tree with its four types of packing.

FIG. 2 is a Packing-tree and its corresponding four packing types of placements. Let $(x_{corner}, y_{corner})$ as the coordinate of the corner, $(x_i, y_i)$ as the bottom-left coordinate of the block $b_i$, and $w_i$ ($h_i$) as the width (height) of the block $b_i$. The root coordinate of a Packing-tree is at $(c_x, c_y)$ for BL-packing,
$(c_x, c_y - h_{root})$ for TL-packing,
$(c_x - w_{root}, c_y - h_{root})$ for TR-packing, and
$(c_x - w_{root}, c_y)$ for BR-packing.

If node $n_j$ is the right child of $n_i$, the block $b_j$ is the lowest adjacent block on the right with $x_j = x_i + w_i$ for BL-packing, the highest adjacent block on the right with $x_j = x_i + w_i$ for TL-packing, the highest adjacent block on the left with $x_j = x_i - w_j$ for TR-packing, and the lowest adjacent block on the left with $x_j = x_i - w_j$ for BR-packing.

If node $n_j$ is the left child of $n_i$, the x-coordinate of block $b_j$ is defined as $x_j = x_i$ for BL-packing,
$x_j = x_i$ for TL-packing,
$x_j = x_i + w_i - w_j$ for TR-packing, and
$x_j = x_i + w_i - w_j$ for BR-packing The block $b_j$ is above the block $b_i$ for BL- and BR-packing, while the block $b_j$ is below the block $b_i$ for TL- and TR-packing. Therefore, given a Packing-tree, the x-coordinate of all blocks can be determined by traversing the tree once in linear time. Further, y-coordinate can be computed by a contour data structure in amortized constant time similar to a known method. See, e.g., Y.-C. Chang, Y.-W. Chang, G.-M. Wu, and S.-W. Wu. B*-trees: A new representation for non-slicing floorplans, in Proceedings of the ACM/IEEE Design Automation Conference, pages 458-463, 2000. So, the complexity of transforming a Packing-tree to the placement is amortized linear time. Note that B*-tree floorplan representation is a BL-type Packing-tree.

Figure 3:
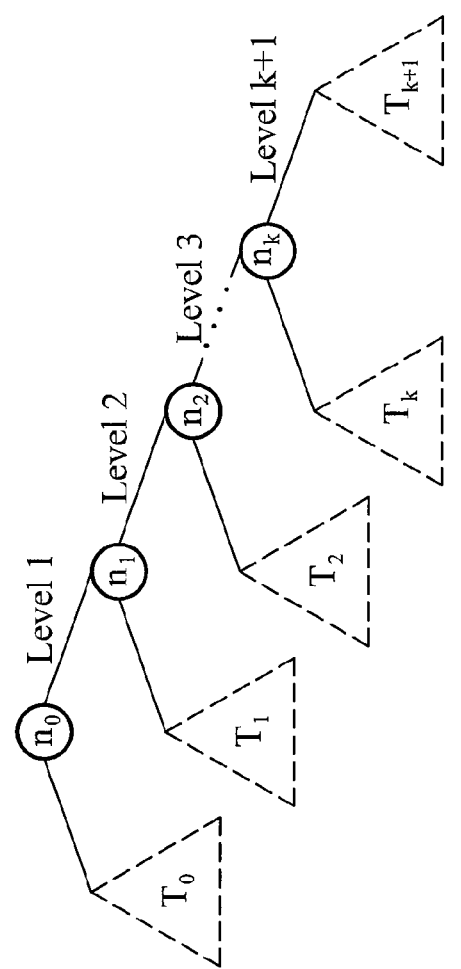
FIG. 3 shows a general Multi-Packing-Tree.

A Multi-Packing-tree combines several Packing-trees with different packing types at difference corners. An example of a general Multi-Packing-tree is shown in FIG. 3. There are k branch nodes in a Multi-Packing-tree to combine k+1 packing sub-trees. A right-skewed stem is used to combine packing sub-trees for convenience and easy implementation, and the order of sub-Packing trees can be determined by the level of the parent node of packing sub-trees. The smaller the level, the earlier the packing sub-tree packs since the DFS order of tree traversal is used for tree packing. If the parent of two packing sub-trees are the same, the packing sub-tree located at the left-child will be packed first. The general Multi-Packing-tree can be used to model any rectilinear floorplan region with each packing sub-tree packs to one convex corner.

Figure 4:
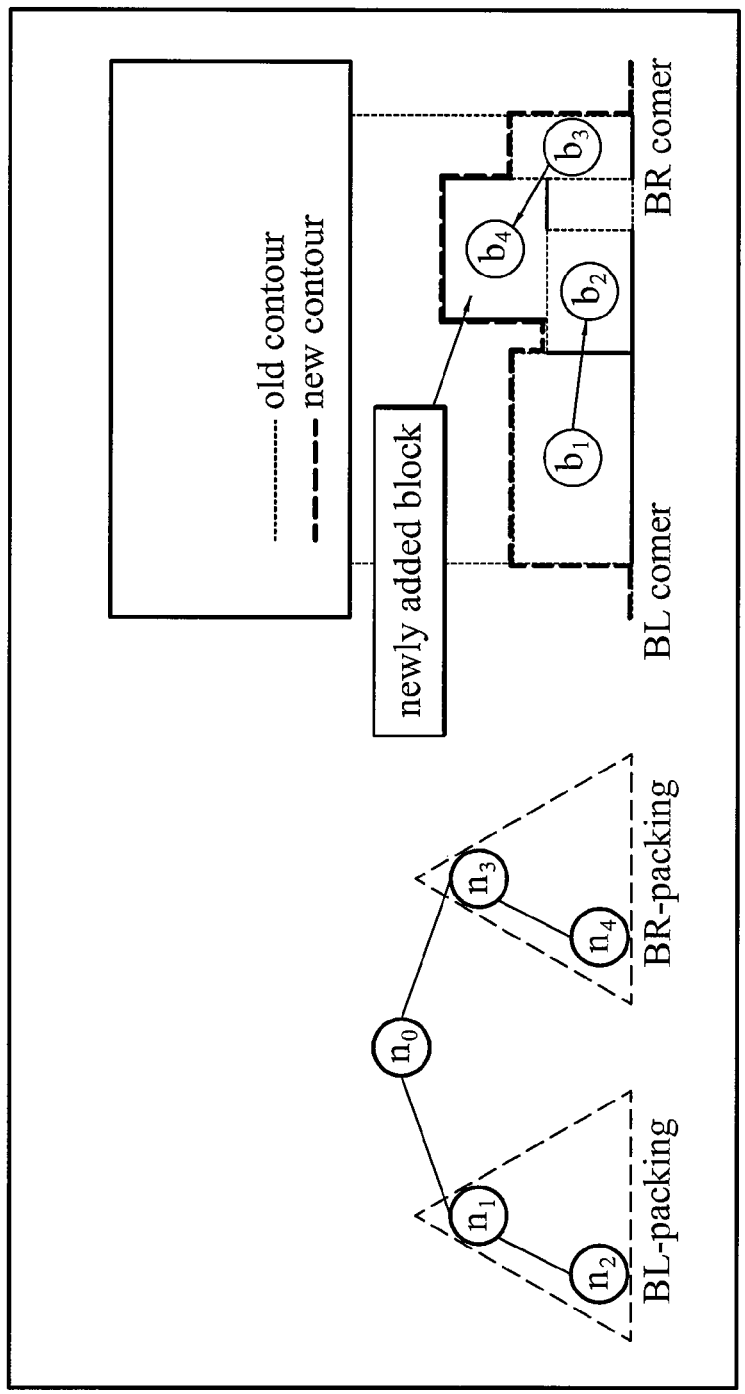
FIG. 4 shows an example of packing for a Multi-Packing-tree with a BL-Packing-tree and a BR-Packing-tree.

Similarly, the x-coordinates of blocks can be determined by a DFS traversal of the Multi-Packing-tree. To compute y-coordinates, two contours are kept, bottom-contour and top-contour, which are initialized according to the bottom-side and the top-side of the given rectilinear region, respectively. All BL- and BR-Packing-trees use one bottom-contour data structure, and all TL- and TR-Packing-trees use on top-contour data structure. FIG. 4 shows an example of packing for a Multi-Packing-tree with a BL-Packing-tree and a BR-Packing-tree. The Packing-trees that use the same contour data structure always generate overlap-free placement since the contour reserves for the space of blocks that are traversed before. So, BL-/BR-Packing-trees may only overlaps with TL-/TR-Packing-trees. However, this kind of solutions should be discarded since they are not feasible.

Figure 5A:
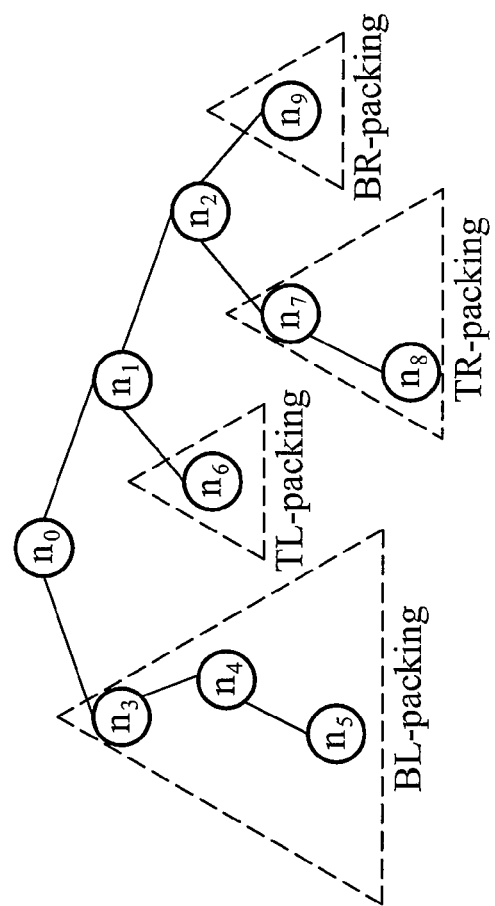
FIG. 5A shows a Multi-Packing-tree with four packing sub-trees.
Figure 5B:
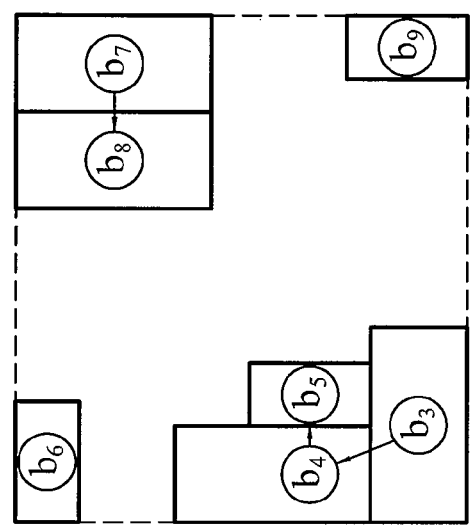
FIG. 5B is a diagram illustrating macro placement corresponding to FIG. 5A, after the nodes are traversed.

For a common rectangle VLSI chip area, a Multi-Packing-tree is used with four packing sub-tree to handle it, as an example shown in FIG. 5A. To obtain the corresponding macro placement, the tree is traversed in the depth-first search (DFS) order from the root $n_0$. Since $n_0$ is a branch node, nothing is done and the traversal continues. Then, the left-child of $n_0$, $n_3$, is the root of the BL-Packing-tree, so b3 is placed on the bottom-left corner. Since $n_3$ does not have a left child, n4 is traversed and the traversal continues. In this example, the packing sub-trees are traversed in the order of BL-Packing-tree, TL-Packing-tree, TR-Packing-tree, and BR-Packing-tree. After all nodes are traversed, the macro placement shown in FIG. 5B is obtained.

Figure 6:
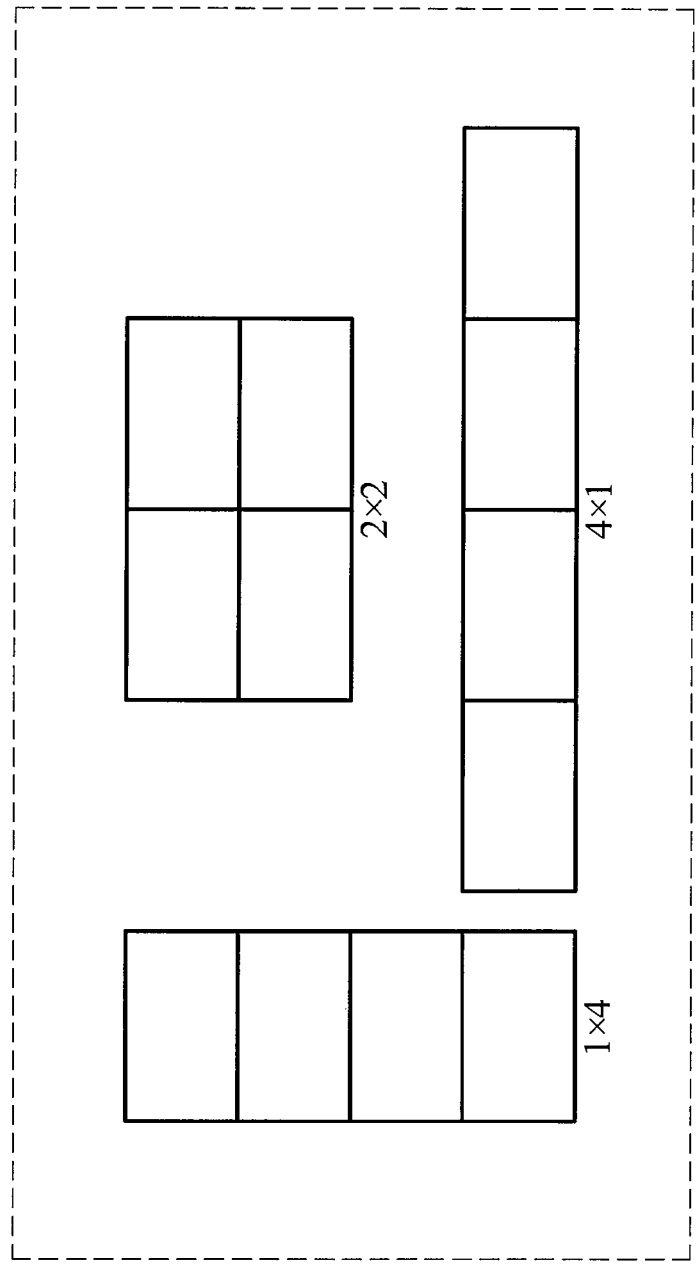
FIG. 6 shows three dimensions of the cluster matrices.

Macro clustering can be used to reduce the problem size. The macros with the same height/width within the same group of the design hierarchy are clustered. These macros usually have strong correlation. Clustering macros not only utilizes the area better, but also places strongly correlated macros closer. The cluster dimension is only considered when there is no wasted area. FIG. 6 is an example of a cluster of four blocks, and it has 3 possible dimensions of the cluster matrices, 1×4, 2×2, and 4×1.

When declustering, the blocks are placed according to the current cluster matrix. A branch and bound method is applied to find the best ordering of the blocks based on the placement cost.

Figure 7:
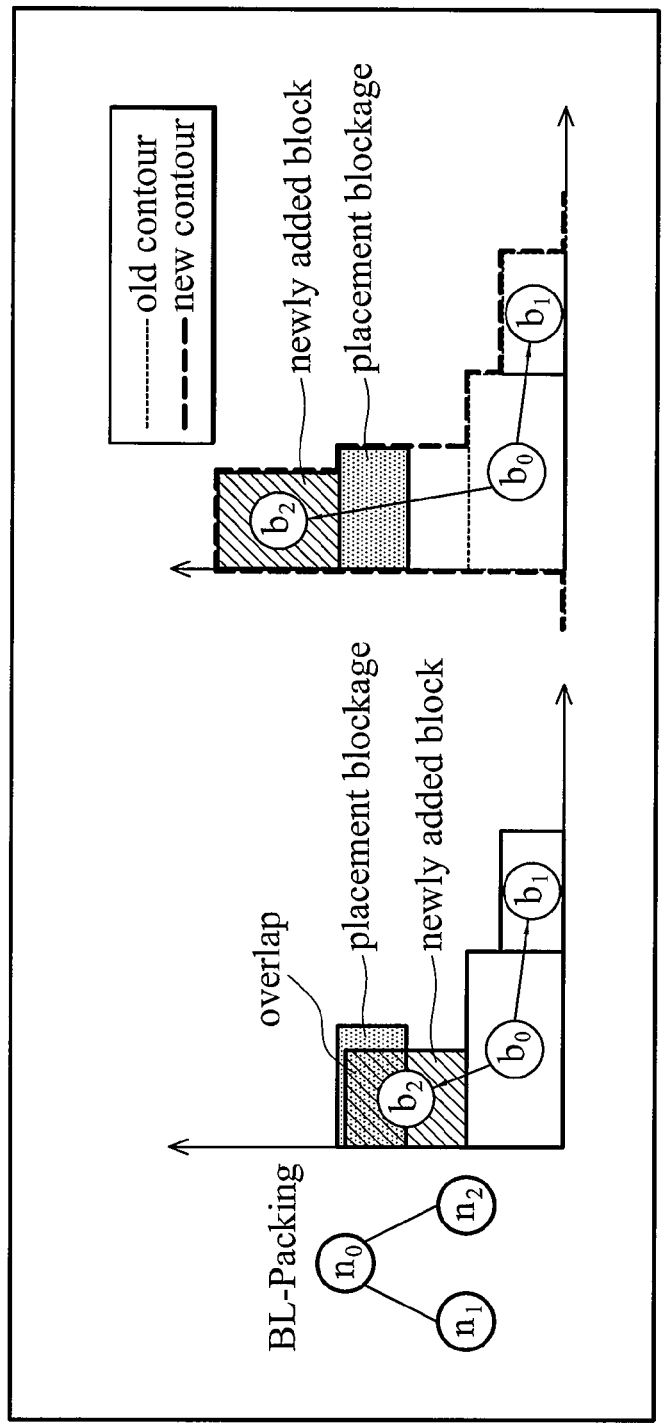
FIG. 7 shows the process of handling a placement blockage.

The placement blockages are given by the user, and no macro can be overlap with the blockages. During packing, a new macro block is added and checked if it overlaps with blockages. If it overlaps, the y-coordinate of the block is shifted to the position without overlapping. FIG. 7 gives an example. Adding a new block b2, it overlaps with the given placement blockage. The block b2 is shifted up to avoid overlapping, and the contour is updated according to the position of block b2. Pre-placed macros are considered as a placement blockage, and no corresponding node will be generated in the Multi-Packing-tree. It can ensure the positions of pre-placed macros.

Corner Macros are described as follows. The analog block is usually fixed at the corner as a corner macro. The node corresponding to the corner block is fixed as the root of the packing sub-tree. Thus, the corner macro can be fixed at the corner.

Figure 8:
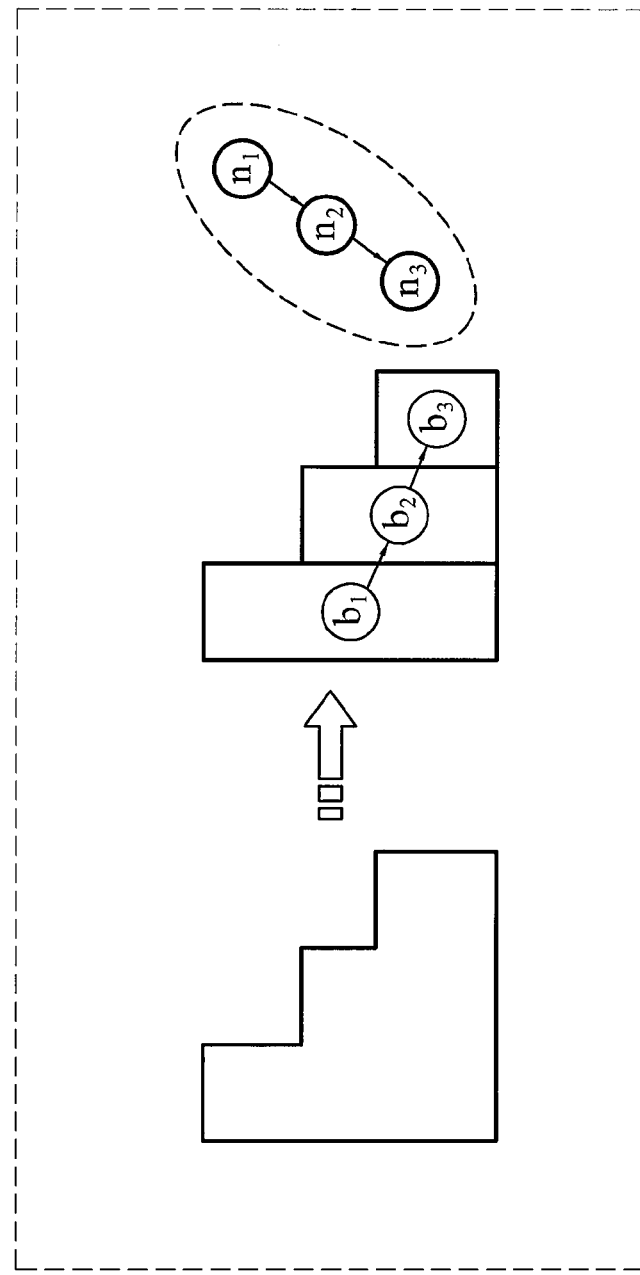
FIG. 8 shows a rectilinear block sliced into several rectangular blocks.

Rectilinear Macros is described as follows. A known method can be adopted to handle rectilinear macros for tree-based floorplanning. See, e.g., G.-M. Wu, Y.-C. Chang, and Y.-W. Chang. Rectilinear block placement using B*-trees. ACM Trans. on Design Automation of Electronic Systems, 8(2):188-202, 2003. A rectilinear macro is sliced into several rectangular blocks. The location constraint (LC for short) according to the tree topology is created. When packing, the mis-alignment situations are fixed to maintain the rectilinear block shape. As the example shown in FIG. 8, the rectilinear block is sliced into three rectangular blocks, and n1, n2, and n3 nodes keep the LC relation.

Operations on Multi-Packing-Tree are described below. A Multi-Packing-tree can be perturbed to get another Multi-Packing-tree by the following operations:
  Op1: Rotate a block (cluster).
  Op2: Resize a cluster.
  Op3: Move a node in a packing sub-tree to another place.
  Op4: Swap two nodes within one or two packing sub-trees.
  Op5: Swap two packing sub-trees.

For Op1, a block (cluster) is rotated for a tree node. For Op2, the clustering dimension of a cluster is changed. Op1 and Op2 do not affect the Multi-Packing-tree structure. For Op3, a node is selected from a packing sub-tree, and moved to another place of the same or different packing sub-tree. For Op4, two nodes are selected from one (two) packing sub-tree(s), and swapped. For Op5, two packing sub-trees are swapped, and it makes the packing order of two packing sub-trees exchanged. Note that the stem structure of a Multi-Packing-tree are fixed and does not effect by any type of operation.

Evaluation of a Macro Placement is described as follows. To distinguish the quality of a macro placement result, the cost of a macro placement F is defined as follows: $\phi = \alpha A + \beta W + \gamma D + \delta O + \epsilon T$, where A is the macro placement area, W is the total wirelength, D is the total macro displacement, O is the vertical overlap length, and $\alpha$, $\beta$, $\gamma$, and $\delta$ are user-specified weighting parameters. The macro placement area, wirelength, macro displacement, and vertical overlap length are explained in the following paragraphs.

Figure 9B:
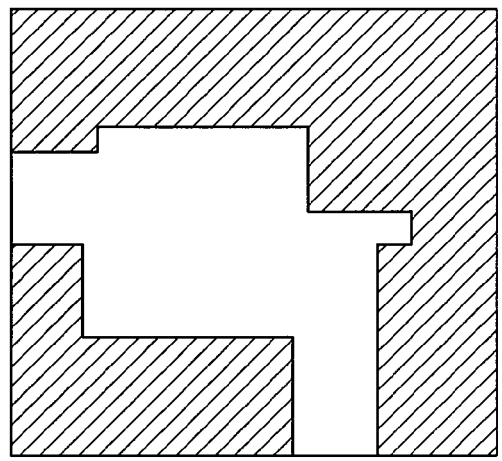
FIG. 9B shows a macro placement area corresponding FIG. 9A.
Figure 9A:
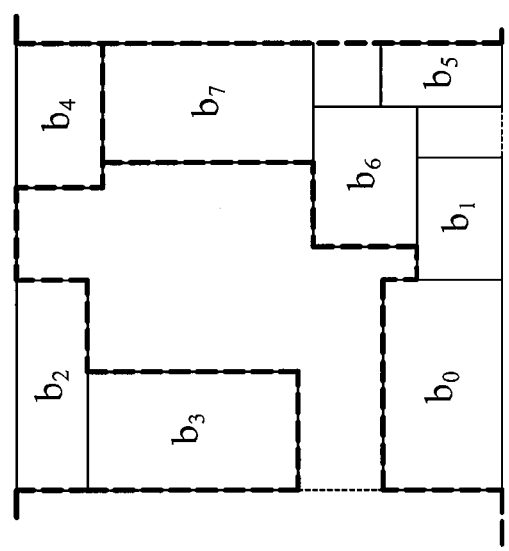
FIG. 9A shows a macro placement result and its top/bottom contours.

The macro placement area is the area under the bottom contour plus the area above the top contour. As shown in FIG. 9A, the contours are plotted in bolded-dashed lines, and the corresponding macro-placement area is shown in FIG. 9B. Minimizing the macro placement area can avoid generating too many island-like standard cell regions, which is surrounding by macros. The routing from this kind of regions to the center of the chip is hard since the many routing blockages are above macro blocks. The routing may be more congestive. Further, the standard cells in this kind of regions need to use longer routing paths to connect to the standard cells located in the chip center, and the timing may be worse.

For the wirelength, since only macros are considered during placement, the netlist from the circuit cannot be directly used. The design hierarchy is used, and pseudo nets are created between macro blocks that are in the same design hierarchy group. So, minimizing the total wirelength can keep the macro blocks in the same design hierarchy group closer.

The macro placement can be guided by a global placement result. The global placement result does not need to be legal. The given macro positions are extracted, and the macro displacement is added as a penalty of the cost function, so that an optimal macro placement with minimum macro displacement can be found.

The Multi-Packing-tree presentation can guarantee no overlaps between top/bottom packing sub-trees. However, the there may exist vertical overlaps between the top contour and the bottom contour. Adding a penalty for the vertical overlap can guide the simulated annealing to find a non-overlap solution.

Figure 10:
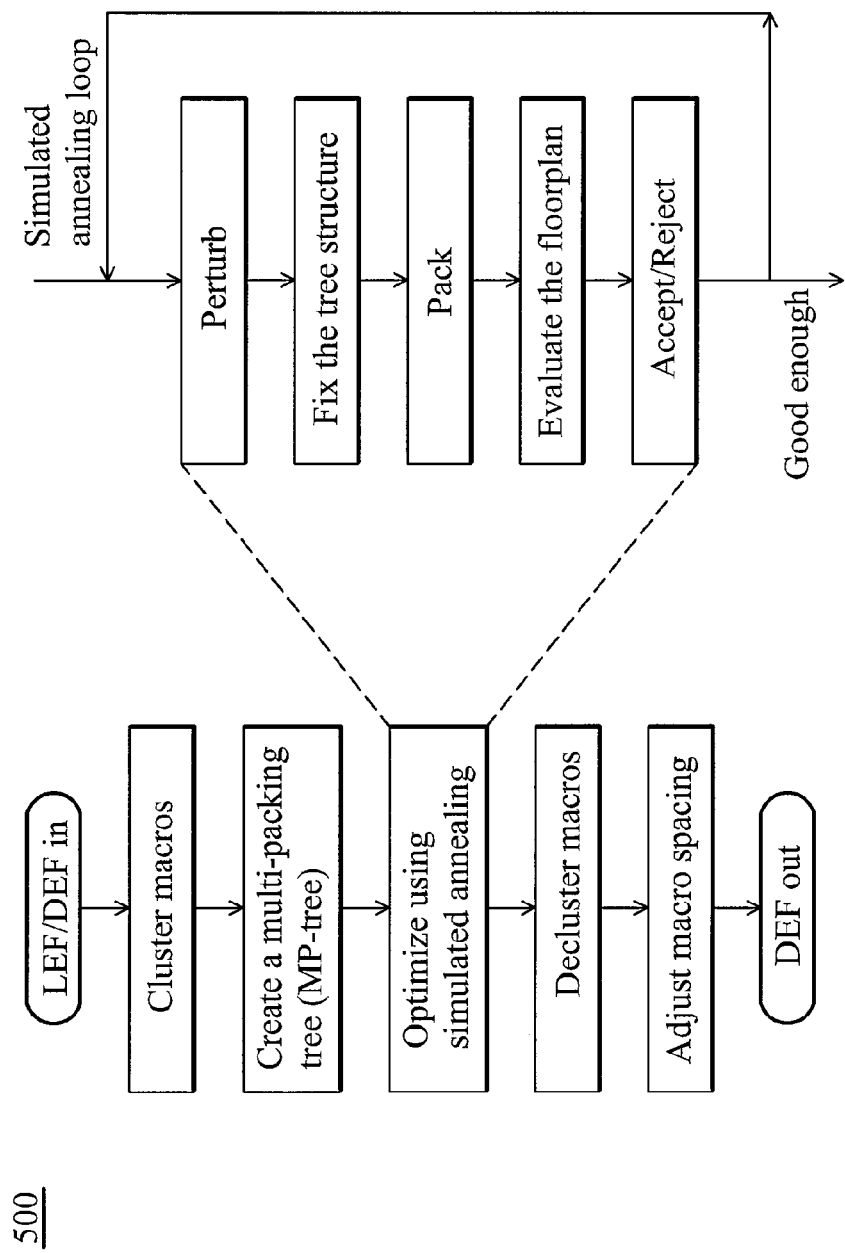
FIG. 10 shows a macro placement flow.

Macro Placement Flow FIG. 10 shows an exemplary macro placement flow. After LEF/DEF files are read, the macros with the same height/width and the same design hierarchy level are first clustered. The cluster dimension is initialized with the one most close to the square, and the final dimension will be selected during simulated annealing optimization.

Then, a Multi-Packing-tree with the given number of packing sub-trees is created. Each macro/cluster corresponds to a node in a packing sub-tree. If the initial macro placement is given, the initial packing sub-tree can be assigned to which a node belongs according the nearest corner for the macro. Otherwise, the initial packing sub-tree that a node belongs to is randomly set. Each packing sub-tree is initialized as a complete binary tree.

Simulated annealing is used to find the optimal macro placement. A Multi-Packing-tree is perturbed to get another Multi-Packing-tree by the aforementioned operations. After perturbation, the designers can fix the tree structure to satisfy the given macro placement constraints, pack the Multi-Packing-tree, evaluate the macro placement, and decide whether the new solution is acceptable according to the macro placement quality difference and the current temperature of simulated annealing. Then, the Multi-Packing-tree is perturbed again. The simulated annealing continues until the solution is good enough or no better solution can be found, and all blocks/clusters positions are determined.

After all block/cluster positions are determined, the positions of blocks inside a cluster can be computed according to the matrix dimension of the cluster.

Finally, the spacing between macros is modified. If the routing resource demand between two macros is higher than the original spacing between macros, the spacing between these two macros is added. Otherwise, the original spacing can be decreased to make the macro placement area smaller. Macro orientation can also be set by horizontal/vertical flipping, so that most pins are closer to the chip center. Then, all macro status is set fixed and the final macro placement is outputted.

Two sets of benchmarks, the Faraday benchmark suite disclosed in ACM Transactions on Design Automation of Electronic Systems by S. N. Adya in 2005 and the mchip benchmark suite composed of five recent large-scale real designs, are used for comparative verification of mixed-size and macro placement. Table I shows the statistics of the Faraday benchmarks. It is noted that the DMA circuit is not used in this comparative verification because there is no macro therein. There are two (seven) macros in each of the DSP (RISC) circuits. The macro area ranges from 6.96% to 41.99% of the whole chip area in these benchmarks.

TABLE I

| Circuit | # of cell | # of nets | # of IOs | Row-Util | # of Macros | Ma-ratio |
|---|---|---|---|---|---|---|
| DSP1 | 26299 | 28447 | 844 | 90.66% | 2 | 21.98% |
| DSP2 | 26279 | 28431 | 844 | 90.05% | 2 | 6.96% |
| RISC1 | 32615 | 34034 | 627 | 93.94% | 7 | 41.99% |
| RISC2 | 32615 | 34034 | 627 | 94.09% | 7 | 37.37% |

Table II shows the mixed-size placement and routing results for Feng Shei 5.1, Capo 9.4, the MPT (Multi-Packing-tree) macro placer of the invention integrated with Capo, mPL5, APlace 2.0, and the MPT macro placer of the invention integrated with APlace on the Faraday benchmarks. A leading commercial router is used to route all placement solutions. All placers are run on a 3.2 GHz Pentium 4 Linux workstation with 2 GB RAM. The "HPWL" (half-perimeter wirelength) and WL (routing wirelength) are reported in the database unit. "Viol" gives the number of violations in the routing solutions. The MPT macro placer needs only a few seconds for these benchmarks because the number of macros is small, and the runtimes for macro placement alone are thus not reported. The star sign * in Table II indicates that the placement result has many overlaps, or blocks are outside the placement region and cannot be legalized. The word "NR" in Table II means no result is obtained due to no allowable placement.

TABLE II

| | Feng Shui 5.1 | | | | | Capo 9.4 | | | | |
|---|---|---|---|---|---|---|---|---|---|---|
| | Place | | Route | | | Place | | Route | | |
| Circuit | HPWL (xE8) | Time (min) | WL (xE8) | Time (min) | Viol | HPWL (xE8) | Time (min) | WL (xE8) | Time (min) | Viol |
| DSP1 | *(13.25) | 6 | NR | NR | NR | 10.09 | 8 | 12.70 | 9 | 1 |
| DSP2 | 9.08 | 6 | 12.10 | 8 | 0 | 8.91 | 8 | 11.37 | 8 | 0 |
| RISC1 | *(18.53) | 17 | NR | NR | NR | 16.35 | 16 | 25.70 | 32 | 265 |
| RISC2 | 1.35 | 17 | 45.10 | 66 | 452321 | 16.02 | 14 | 23.75 | 22 | 6 |
| Avg. | 1.35 | | 1.68 | | | 1.15 | | 1.15 | | |

| | MPT macro placer + Capo 9.4 | | | | | mPL5 | | | | |
|---|---|---|---|---|---|---|---|---|---|---|
| | Place | | Route | | | Place | | Route | | |
| Circuit | HPWL (xE8) | Time (min) | WL (xE8) | Time (min) | Viol | HPWL (xE8) | Time (min) | WL (xE8) | Time (min) | Viol |
| DSP1 | 9.32 | 7 | 12.06 | 7 | 0 | 13.41 | 4 | 18.69 | 14 | 8998 |
| DSP2 | 8.98 | 7 | 11.50 | 7 | 0 | 11.22 | 4 | 14.87 | 13 | 1 |
| RISC1 | 14.63 | 12 | 21.54 | 25 | 6 | 24.92 | 8 | 36.60 | 70 | 99613 |
| RISC2 | 14.04 | 12 | 19.51 | 13 | 2 | 23.90 | 10 | 33.50 | 19 | 29682 |
| Avg. | 1.35 | | 1.68 | | | 1.63 | | 1.62 | | |

| | Aplace | | | | | MPT macro placer + APlace 2.0 | | | | |
|---|---|---|---|---|---|---|---|---|---|---|
| | Place | | Route | | | Place | | Route | | |
| Circuit | HPWL (xE8) | Time (min) | WL (xE8) | Time (min) | Viol | HPWL (xE8) | Time (min) | WL (xE8) | Time (min) | Viol |
| DSP1 | *(9.04) | 20 | NR | NR | NR | 8.88 | 13 | 11.57 | 8 | 1 |
| DSP2 | 8.69 | 11 | 11.20 | 8 | 0 | 8.65 | 12 | 11.12 | 8 | 0 |
| RISC1 | *(13.07) | 22 | NR | NR | NR | 13.12 | 25 | 19.96 | 25 | 0 |
| RISC2 | *(13.80) | 22 | NR | NR | NR | 13.27 | 21 | 19.87 | 24 | 0 |
| Avg. | *(1.01) | | 1.01 | | | 1.00 | | 1.00 | | |

From the results, it is found that the min cut placer Feng Shui generates results with many macros/cells outside the chip region. Though mPL5 does not claim to be a mixed-size placer, mPL5 generates high quality solutions for IBM-MS/IBM-MSw Pins benchmarks with mixed-size macros and standard cells. Accordingly, mPL5 placement on the Faraday benchmarks is performed for reference. It is found that mPL5 finds allowable solutions but the quality thereof is not good. In addition, it is found that APlace generates many overlaps between macros for DSP1, RISC1, and RISC2 and cannot be legalized. As a result, only the HPWLs of its global placement solutions are reported. The min-cut floorplacer Capo finds legal solutions and its HPWLs are better than Feng Shui, and mPL5.

The two-stage mixed-size placement approaches utilizing the MPT macro placer according to an embodiment of the invention can determine allowable placement solutions for all the circuits. The MPT macro placer integrated with Capo reduces the respective HPWL and routing wirelength by 8% and 12% on average, compared with Capo alone. In particular, the MPT macro placer integrated with APlace generates feasible placement for all the circuits, and the quality is superior to all the mixed-size placers. The HPWL's are respectively reduced by 63%, 35%, and 15%, compared with mPL5, Feng Sui, and Capo. Furthermore, the routing wirelengths are respectively 62%, 68%, and 15% shorter than mPL5, Feng Sui, and Capo. It is also found that as the total macro area increases, HPWL reduction of the placement flow utilizing the MPT macro placer according to an embodiment of the invention increases accordingly. Wirelength reduction is summarized in Table III, illustrating effectiveness of the MPT macro placer.

TABLE III

| Circuit | Macro Area | Normalized HPWL | | | Normalized WL | | |
|---|---|---|---|---|---|---|---|
| | | Capo | MPT + Capo | MPT + Aplace | Capo | MPT + Capo | MPT + Aplace |
| DSP2 | 6.96% | 1.00 | 1.01 | 0.97 | 1.00 | 1.01 | 0.98 |
| DSP1 | 21.98% | 1.00 | 0.92 | 0.88 | 1.00 | 0.95 | 0.91 |
| RISC2 | 37.37% | 1.00 | 0.88 | 0.83 | 1.00 | 0.82 | 0.84 |
| RISC1 | 41.99% | 1.00 | 0.89 | 0.80 | 1.00 | 0.84 | 0.78 |

Table IV shows statistics of the mchip benchmark suite. The number of cells ranges from 540 k to 1320 k, and the number of macros from 50 to 380. It is known that only Capo can determine allowable placement with good quality for mixed-size placement with large macros, comparisons of macro placement are made with Capo. The experiment is carried out on a dual Opteron 2.6 GHz machine and begins with running the MPT macro placer and Capo to determine the positions of macros. Thereafter, macros are fixed and standard cells placed using a commercial congestion-driven placer in a fast prototyping mode. A commercial router performs global routing. For fair comparison, the standard cells are placed by the same placer.

TABLE IV

| Circuit | # of cell | # of nets | Row-Util | # of Macros | Ma-ratio |
|---|---|---|---|---|---|
| mchip1 | 540k | 570k | 94% | 50 | 66% |
| mchip2 | 820k | 860k | 91% | 95 | 56% |
| mchip3 | 910k | 960k | 88% | 110 | 54% |
| mchip4 | 1320k | 1300k | 90% | 380 | 36% |
| mchip5 | 1230k | 1260k | 58% | 138 | 30% |

Table V shows the HPWLs, routing wirelengths (WL), GRC overflows, and maximum overflows. The GRC overflow is the percentage of the global routing cells (GRC's) that have overflow. The larger the value, the more congested the placement. Maximum overflow provides the number of extra tracks assigned for the global routing cell with the maximum overflow. NR in Table V indicates no placement result is obtained for routing due to the segmentation faults in Capo.

TABLE V

| | Capo | | | | | |
|---|---|---|---|---|---|---|
| | Place | | Route | | | |
| Circuit | HPWL (xE7) | Time (min) | WL (xE7) | Time (min) | GRC Overflow | Max Overflow |
| mchip1 | 5.84 | 16 | 6.56 | 23 | 0.7% | 39 |
| mchip2 | 5.65 | 28 | 6.65 | 32 | 1.0% | 27 |

TABLE V-continued

| mchip3 | 10.00 | 23 | 16.90 | 180 | 36.4% | 113 |
| mchip4 | 14.12 | 41 | 14.16 | 323 | 1.4% | 288 |
| mchip5 | Seg. fault | | NR | NR | NR | NR |

| | MPT macro placer | | | | | |
|---|---|---|---|---|---|---|
| | Place | | Route | | | |
| Circuit | HPWL (xE7) | Time (min) | WL (xE7) | Time (min) | GRC Overflow | Max Overflow |
| mchip1 | 5.26 | 8 | 6.13 | 7 | 0.7% | 5 |
| mchip2 | 4.72 | 13 | 5.34 | 8 | 0.1% | 4 |
| mchip3 | 5.26 | 16 | 6.02 | 14 | 0.1% | 4 |
| mchip4 | 11.76 | 31 | 13.27 | 45 | 0.1% | 31 |
| mchip5 | 8.92 | 30 | 9.85 | 27 | 0.0% | 2 |

For the five mchip benchmarks, the MPT macro placer consistently obtains much better wirelengths (HPWL and WL) than Capo's macro placement. For the mchip 5 circuit, segmentation faults occur and no solution can be found after several tries when using Capo. Furthermore, Capo's macro placement results in larger GRC overflow and maximum overflow and requires more running time for the cell placement and routing than the MPT macro placer.

The invention provides a multi-packing tree (MPT)-based macro placer which places macros around a boundary of a placement region and reserves a center thereof for standard cells. The MPT macro placer is very fast for operations and packing of binary trees, with only amortized linear time needed to transform an MPT to its corresponding macro placement. As a result, a solution of macro placement is efficiently searched by simulated annealing. The packing techniques are, further, efficient and effective for area minimization, such that the MPT-base macro placer can solve mixed-size placement problems with very large macros and a large number of macros. Since macro orientations and spacing between macros are considered, the MPT-base macro placer leads to significantly shorter wirelength and less congestion than other mixed-size placers. The MPT-base macro placer can also easily function within various placement constraints, such as pre-placed blocks, corner blocks, and placement blockages. The MPT-base macro placer can be combined with state-of-the-art standard cell placers to obtain better mixed-size placement solutions based on a two-stage mixed-size placement flow.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of macro placement executed by a computer, comprising:
    creating a k-level multi-packing tree, the k-level multi-packing tree comprising k branch nodes and k+1 binary packing sub-trees, wherein each packing sub-tree comprises at least one node, and each node corresponds to a macro block, and k is larger than or equal to 1; and
    packing the macros of each different binary packing sub-tree in different corners of a placement region in order to keep center of the placement region unpacked by the macros;

wherein each branch node corresponds to one level, and each binary packing sub-tree corresponds to one of the branch nodes and comprises a group of macros.

2. The method of macro placement as claimed in claim 1, wherein the macros of each binary packing sub-tree are close packed toward a direction of the placement region and the direction corresponding to each binary packing sub-tree is different from others.

3. The method of macro placement as claimed in claim 1, wherein the macros of each binary packing sub-tree are close packed toward an edge of the placement region and the edge corresponding to each binary packing sub-tree is different from others.

4. The method of macro placement as claimed in claim 1, wherein the macros of each binary packing sub-tree are close packed toward a corner of the placement region and the corner corresponding to each binary packing sub-tree is different from others.

5. A multi-packing tree (MPT) macro placer implemented by software codes executed by a computer, performing steps of:
   reading input files in a LEF format or a DEF format;
   creating a k-level multi-packing tree comprising k branch nodes each corresponding to one level and k+1 binary packing sub-trees each corresponding to one of the nodes and comprising a group of macros according to the input files, wherein each packing sub-tree comprises at least one node, and each node corresponds to a macro block, and k is larger than or equal to 1;
   optimizing the multi-packing tree according to a packing result thereof, wherein the packing result comprises macros of each different binary packing sub-tree packed in different corners of a placement region while center of the placement region is left unpacked by the macros; and
   generating output files in said DEF format according to the multi-packing tree.

6. The MPT macro placer as claimed in claim 5, further comprising adjusting spacing between macros after packing of the macros.

7. The MPT macro placer as claimed in claim 5, further comprising clustering the macros with the same height and width within the same group of design hierarchy after reading the input files in the LEF format or the DEF format and declustering the macros before generating the output files in the DEF format.

8. The MPT macro placer as claimed in claim 7, wherein optimizing the multi-packing tree comprises iteration of a simulated annealing loop comprising perturbing the multi-packing tree, packing the macros in the multi-packing tree, evaluating macro placement of packing, and accepting or rejecting the macro placement.

9. The MPT macro placer as claimed in claim 8, wherein the simulated annealing loop further comprises fixing structure of the multi-packing tree according to within given macro placement constraints.

10. The MPT macro placer as claimed in claim 8, wherein the iteration of the simulated annealing loop ends when a packing solution is acceptable or no better packing solution can be found.

11. The MPT macro placer as claimed in claim 8, wherein perturbing the multi-packing tree comprises rotating a macro block or a macro cluster, resizing a macro cluster, moving one of the nodes in one of the binary packing sub-trees to another place, swapping two nodes within the same or different binary packing sub-trees, swapping two binary packing sub-trees or a combination thereof.

12. A mixed-size placement design method executed by a computer, comprising:
   reading initial input files in a LEF format or a DEF format;
   performing preliminary macro placement according to the initial input files with a macro placer, wherein the macro placer is a multi-packing tree (MPT) macro placer performing steps of:
   reading said initial input files in said LEF format or said DEF format;
   creating a k-level multi-packing tree comprising k branch nodes each corresponding to one level and k-F1 binary packing sub-trees each corresponding to one of the nodes and comprising a group of macros according to the initial input files, wherein each packing sub-tree comprises at least one node, and each node corresponds to a macro block, and k is larger than or equal to 1;
   optimizing the multi-packing tree according to a packing result thereof, wherein the packing result comprises macros of each different binary packing sub-tree packed in different corners of a placement region while center of the placement region is left unpacked by the macros;
   generating output files in said DEF format according to the multi-packing tree;
   performing detailed macro placement with the MPT macro placer according to results of the preliminary macro placement; and
   generating final output files in said DEF format according to results of the detailed macro placement.

13. The mixed-size placement design method as claimed in claim 12, further comprising performing standard cell placement before generating final output files in said DEF format.

* * * * *